(12) United States Patent
Chen et al.

(10) Patent No.: US 7,944,254 B2
(45) Date of Patent: May 17, 2011

(54) SWITCHING CIRCUIT

(75) Inventors: Yang-Yuan Chen, Taipei Hsien (TW);
Ming-Chih Hsieh, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/630,855

(22) Filed: Dec. 4, 2009

(65) Prior Publication Data
US 2011/0025405 A1 Feb. 3, 2011

(30) Foreign Application Priority Data

Jul. 31, 2009 (CN) .......................... 2009 1 0305056

(51) Int. Cl.
*H03L 7/00* (2006.01)
(52) U.S. Cl. ........................................ 327/142; 327/365
(58) Field of Classification Search .................. 327/142, 327/365, 482
See application file for complete search history.

(56) References Cited

U.S. PATENT DOCUMENTS 6,833,741 B2 * 12/2004 Park .............................. 327/143
7,759,989 B2 * 7/2010 Chang ........................... 327/143

* cited by examiner

*Primary Examiner* — Hai L Nguyen
(74) *Attorney, Agent, or Firm* — Zhigang Ma

(57) ABSTRACT

A switching circuit includes a first switching module, a second switching module, a first relay module, a second relay module, and a processing module. The first switching module includes a switch and a first transistor. The base of the first transistor functions as a first reset terminal. The second switching module includes a second transistor. An output terminal of the second relay module functions as a second reset terminal. Two input terminals of the processing module are connected to the first and second reset terminals respectively. The processing module resets a system with a first type or a second type according to voltages of the first and second reset terminals.

14 Claims, 2 Drawing Sheets

SWITCHING CIRCUIT

BACKGROUND

1. Technical Field

The present disclosure relates to a switching circuit.

2. Description of Related Art

A switching circuit is used to control a terminal. On condition that two terminals need to be controlled in a circuit, two switching circuits will be needed to control the two terminals respectively, which is costly.

DETAILED DESCRIPTION

Figure 1:
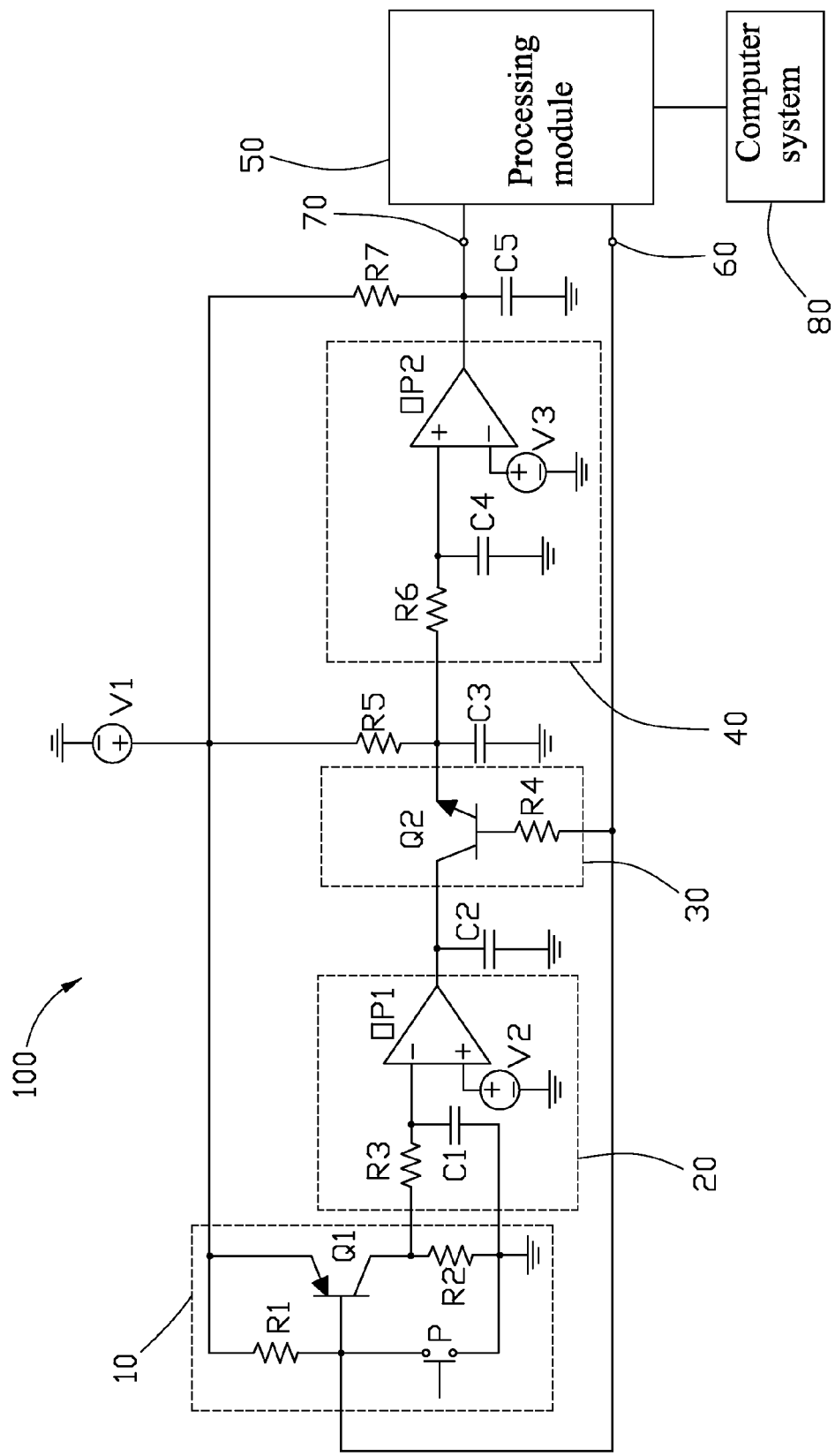
FIG. 1 is a circuit diagram of an exemplary embodiment of a switching circuit, the switching circuit including a processing module.

Referring to FIG. 1, an exemplary embodiment of a switching circuit 100 includes a first switching module 10, a second switching module 30, a first relay module 20, a second relay module 40, a processing module 50, a first reset terminal 60, and a second reset terminal 70.

The first switching module 10 includes a pnp transistor Q1, a switch P, and two resistors R1 and R2. An emitter of the pnp transistor Q1 is connected to a first power source V1. The emitter of the pnp transistor Q1 is further connected to a base of the pnp transistor Q1 via the resistor R1. The base of the pnp transistor Q1 functions as the first reset terminal 60 of the switching circuit 100, and is grounded via the switch P. A collector of the pnp transistor Q1 is grounded via the resistor R2.

The first relay module 20 includes a resistor R3, a capacitor C1, a second power source V2, and a dual operational amplifier OP1. A first end of the resistor R3 is connected to the collector of the pnp transistor Q1. A second end of the resistor R3 is grounded via the capacitor C1. An inverting terminal of the dual operational amplifier OP1 is connected to the second end of the resistor R3. A non-inverting terminal of the dual operational amplifier OP1 is connected to the second power source V2. An output terminal of the dual operational amplifier OP1 is grounded via a capacitor C2. In the embodiment, the resistor R3 and the capacitor C1 compose an RC relay circuit to relay the voltage outputted from the collector of the pnp transistor Q1. The second power source V2 functions as a reference voltage of the dual operational amplifier OP1. The capacitor C2 is used to filter the voltage outputted from the output terminal of the dual operational amplifier OP1.

The second switching module 30 includes a resistor R4 and an npn transistor Q2. A collector of the npn transistor Q2 is connected to the output terminal of the dual operational amplifier OP1. A base of the npn transistor Q2 is connected to the base of the pnp transistor Q1 via the resistor R4. An emitter of the npn transistor Q2 is connected to the first power source V1 via a resistor R5. The emitter of the npn transistor Q2 is further grounded via a capacitor C3. In the embodiment, the capacitor C3 is used to filter the voltage outputted from the emitter of the npn transistor Q2.

The second relay module 40 includes a resistor R6, a capacitor C4, a dual operational amplifier OP2, and a third power source V3. A first end of the resistor R6 is connected to the emitter of the npn transistor Q2. A second end of the resistor R6 is grounded via the capacitor C4. A non-inverting terminal of the dual operational amplifier OP2 is connected to the second end of the resistor R6. An inverting terminal of the dual operational amplifier OP2 is connected to the third power source V3. An output terminal of the dual operational amplifier OP2 is connected to the first power source V1 via a resistor R7. The output terminal of the dual operational amplifier OP2 is further grounded via a capacitor C5, and functions as the second reset terminal 70 of the switching circuit 100. In the embodiment, the resistor R6 and the capacitor C4 compose an RC relay circuit to relay the voltage outputted from the emitter of the npn transistor Q2. The second power source V2 functions as a reference voltage of the dual operational amplifier OP2. The capacitor C5 is used to filter the voltage outputted from the output terminal of the dual operational amplifier OP2.

Figure 2:
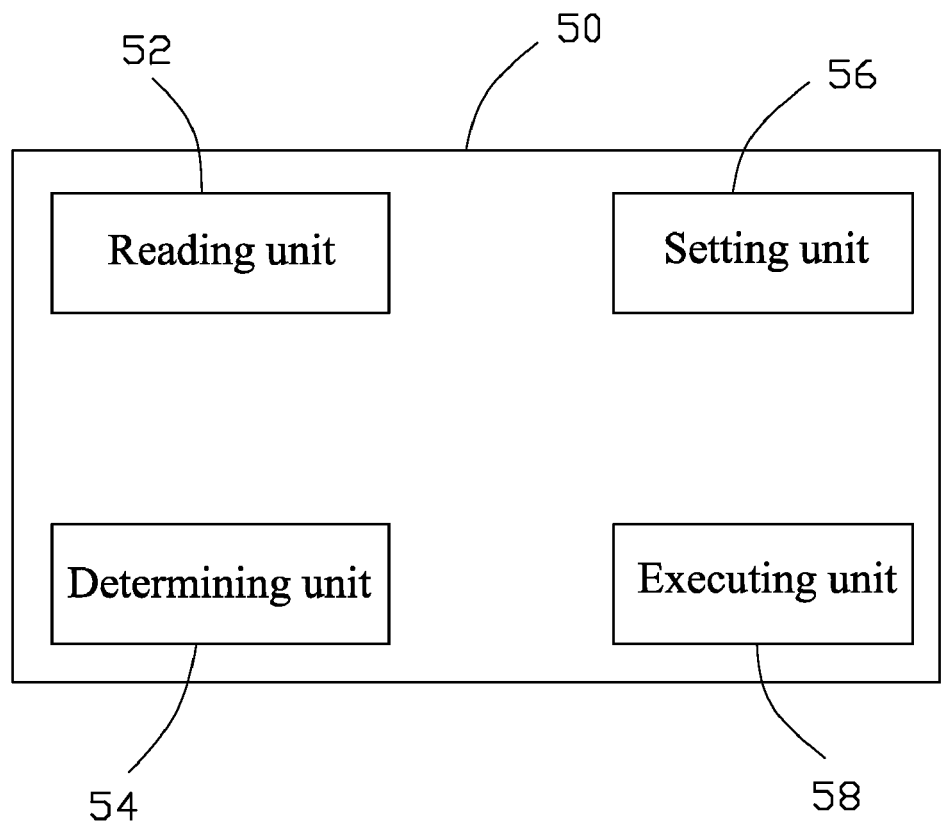
FIG. 2 is a block diagram of the processing module in FIG. 1.

The first reset terminal 60 and the second reset terminal 70 are connected to the processing module 50. Referring to FIG. 2, the processing module 50 includes a reading unit 52, a determining unit 54, a setting unit 56, and an executing unit 58. The reading unit 52 reads voltages of the first reset terminal 60 and the second reset terminal 70. The determining unit 54 determines the voltages of the first reset terminal 60 and the second reset terminal 70. The executing unit 58 outputs a reset signal to reset a computer system 80 which is connected to the processing module 50 according to the voltages of the first reset terminal 60 and the second reset terminal 70. The setting unit 56 sets a preset time.

When the switch P is un-actuated, the switch P is turned off, the pnp transistor Q1 is turned off. The base of the pnp transistor Q1 is at a high level, such as 5 volts. As a result, the first reset terminal 60 is at a high level. The npn transistor Q2 is turned on.

The inverting input terminal of the dual operational amplifier OP1 is at a low level, such as 0 volts, because the pnp transistor Q1 is turned off. As a result, the output terminal of the dual operational amplifier OP1 is at a high level. The emitter of the npn transistor Q2 is at a high level because the npn transistor Q2 is turned on. Therefore, the output terminal of the dual operational amplifier OP2 is at a high level. The second reset terminal 70 is at a high level.

The reading unit 52 reads the voltages of the first reset terminal 60 and the second reset terminal 70. Because the determining unit 54 determines that the voltages of the first reset terminal 60 and the second reset terminal 70 are at high level, the executing unit 58 does not output reset signals to the system 80.

When the switch P is actuated, the switch P is turned on, the pnp transistor Q1 is turned on. The base of the pnp transistor Q1 is at a low level. As a result, the first reset terminal 60 is at a low level.

On this condition, the determining unit 54 determines that the first reset terminal 60 is at a low level. If the first reset terminal 60 is at a low level for at least a predetermined duration set by the setting unit 56, the executing unit 58 outputs a first reset signal to the computer system 80 to reset the computer system 80 with a first type. In the embodiment, the first reset signal is used to soft boot the computer system 80. If the first reset terminal 60 is at a low level under the predetermined duration, the determining unit 54 determines the voltage of the second output 70.

When the switch P is released, the switch P is turned off again. Because of the RC relay circuit of the resistor R3 and the capacitor C1, the inverting input terminal of the dual operational amplifier OP1 receives a low level voltage for a time at first according to the RC relay circuit. The inverting input terminal of the dual operational amplifier OP1 receives a high level voltage after the time has passed.

At this time, the npn transistor Q2 is turned on. The non-inverting input terminal of the dual operational amplifier OP2 receives the voltage from the emitter of the npn transistor Q2. As a result, the non-inverting input terminal of the dual operational amplifier OP2 receives a low level voltage for the time. The non-inverting input terminal of the dual operational amplifier OP2 receives a high level voltage. Therefore, the output terminal of the dual operational amplifier OP2 is at a low level at first, and then at a high level.

On this condition, the determining unit 54 determines that the second reset terminal 70 being at a low level at first, and then at a high level. As a result, the executing unit 58 outputs a second reset signal to the computer system 80 to reset the computer system 80 with a second type. In the embodiment, the second reset signal is used to hard boot the computer system 80.

As described above, the switch P can soft boot or hard boot the computer system 80 correspondingly. As a result, the switching circuit 100 is provided with two functions.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A switching circuit comprising:
a first switching module comprising a switch and a first transistor, wherein an emitter of the first transistor is connected to a first power source, a base of the first transistor is grounded via the switch, and connected to the emitter of the first transistor via a first resistor, a collector of the first transistor is grounded via a second resistor, the base of the first transistor functions as a first reset terminal;
a first relay module comprising an input terminal connected to the collector of the pnp transistor, and an output terminal;
a second switching module comprising a second transistor, wherein a collector of the second transistor is connected to the output terminal of the first relay module, a base of the second transistor is connected to the base of the first transistor, an emitter of the second transistor is connected to the first power source via a third resistor;
a second relay module comprising an input terminal connected to the emitter of the second transistor, and an output terminal functioning as a second reset terminal; and
a processing module comprising two input terminals connected to the first and second reset terminals respectively, wherein the processing module resets a computer system with a first type or a second type according to voltages of the first and second reset terminals.

2. The switching circuit of claim 1, wherein the processing unit comprises a reading unit, a determining unit, and an executing unit, wherein the reading unit reads the voltages of the first and second reset terminals, the determining unit determines status of the voltages of the first and second reset terminals, the executing unit outputs a first reset signal or a second reset signal according to the status of the voltages of the first and second reset terminals.

3. The switching circuit of claim 2, wherein the processing module further comprises a setting unit to set a predetermined duration; wherein upon the condition that the switch is actuated to be on for the predetermined duration at first, and then is un-actuated, the first reset terminal is at a low level for the predetermined duration, to output a first reset signal to reset the computer system.

4. The switching circuit of claim 3, wherein the first reset signal is a soft boot signal to soft boot the computer system.

5. The switching circuit of claim 2, wherein the processing module further comprises a setting unit to set a predetermined duration; wherein upon the condition that the switch is actuated under the predetermined duration, the second reset terminal is at a low level at first, and then at a high level, to output a second reset signal to reset the computer system.

6. The switching circuit of claim 5, wherein the second reset signal is a hard boot signal to hard boot the computer system.

7. The switching circuit of claim 1, wherein the first relay circuit comprises a dual operational amplifier, an inverting terminal of the dual operational amplifier is connected to the collector of the first transistor via a fourth resistor, a non-inverting terminal of the dual operational amplifier is connected to a second power source, an output terminal of the dual operational amplifier is connected to the collector of the second transistor.

8. The switching circuit of claim 7, wherein the inverting terminal of the dual operational amplifier is grounded via a capacitor.

9. The switching circuit of claim 7, wherein the output terminal of the dual operational amplifier is grounded via a capacitor.

10. The switching circuit of claim 1, wherein the second relay circuit comprises a dual operational amplifier, an inverting terminal of the dual operational amplifier is connected to a second power source, a non-inverting terminal of the dual operational amplifier is connected to the emitter of the NPN transistor via a fourth resistor.

11. The switching circuit of claim 10, wherein the inverting terminal of the dual operational amplifier is grounded via a capacitor.

12. The switching circuit of claim 10, wherein the output terminal of the dual operational amplifier is grounded via a capacitor.

13. The switching circuit of claim 1, wherein the first transistor is a pnp transistor.

14. The switching circuit of claim 1, wherein the second transistor is an npn transistor.

* * * * *